United States Patent
Kramer et al.

(10) Patent No.: US 11,726,411 B2
(45) Date of Patent: Aug. 15, 2023

(54) SUBSTRATE SHAPE MEASURING DEVICE, SUBSTRATE HANDLING DEVICE, SUBSTRATE SHAPE MEASURING UNIT AND METHOD TO HANDLE SUBSTRATES

(71) Applicant: ASML NETHERLANDS B.V., Veldhoven (NL)

(72) Inventors: Gijs Kramer, Nijmegen (NL); Ringo Petrus Cornelis Van Dorst, Boxtel (NL)

(73) Assignee: ASML NELHERLANDS B.V., Veldhoven (NL)

( * ) Notice: Subject to any disclaimer, the term of this patent is extended or adjusted under 35 U.S.C. 154(b) by 0 days.

(21) Appl. No.: 17/625,467

(22) PCT Filed: Jun. 8, 2020

(86) PCT No.: PCT/EP2020/065873
§ 371 (c)(1),
(2) Date: Jan. 7, 2022

(87) PCT Pub. No.: WO2021/008781
PCT Pub. Date: Jan. 21, 2021

(65) Prior Publication Data
US 2022/0276565 A1 Sep. 1, 2022

(30) Foreign Application Priority Data

Jul. 12, 2019 (EP) .................... 19185930

(51) Int. Cl.
*G03F 7/20* (2006.01)
*H01L 21/67* (2006.01)
*G03F 7/00* (2006.01)

(52) U.S. Cl.
CPC ...... *G03F 7/7085* (2013.01); *H01L 21/67288* (2013.01)

(58) Field of Classification Search
CPC ............... G03F 7/70783; G03F 7/7085; H01L 21/67288
See application file for complete search history.

(56) References Cited

U.S. PATENT DOCUMENTS

| 5,798,532 A | 8/1998 | Linehan |
| 6,020,964 A | 2/2000 | Loopstra et al. |
| (Continued) | | |

FOREIGN PATENT DOCUMENTS

| CN | 208833198 | 5/2019 |
| EP | 3385792 | 10/2018 |
| (Continued) | | |

OTHER PUBLICATIONS

International Search Report and Written Opinion issued in corresponding PCT Patent Application No. PCT/EP2020/065873, dated Sep. 3, 2020.

(Continued)

*Primary Examiner* — Deoram Persaud
(74) *Attorney, Agent, or Firm* — Pillsbury Winthrop Shaw Pittman, LLP

(57) ABSTRACT

A substrate shape measuring device, including: a substrate support to support a substrate having a main surface, the main surface of the substrate when supported by the substrate support substantially extending in a first plane; one or more sensor assemblies, each including a light emitter to emit light along a light axis substantially parallel to the first plane and a light sensor arranged to receive the light; and a processing device arranged to determine a shape of the substrate, wherein the substrate shape measuring device is (Continued)

constructed to measure with the one or more sensor assemblies in at least a first measurement direction with respect to the substrate substantially parallel to the first plane and a second measurement direction with respect to the substrate substantially parallel to the first plane.

20 Claims, 6 Drawing Sheets

(56) References Cited

U.S. PATENT DOCUMENTS

| | | | |
|---|---|---|---|
| 6,952,253 | B2 | 10/2005 | Lof et al. |
| 8,228,509 | B2* | 7/2012 | Akamatsu ............... G01B 11/24 |
| | | | 356/610 |
| 8,582,963 | B2* | 11/2013 | Li ........................... F27D 19/00 |
| | | | 219/390 |
| 10,446,423 | B2* | 10/2019 | Su ........................... G01B 11/24 |
| 2006/0109484 | A1* | 5/2006 | Akamatsu ............ G01B 11/028 |
| | | | 356/613 |
| 2007/0058173 | A1 | 3/2007 | Holzapfel |
| 2010/0134615 | A1 | 6/2010 | Akamatsu et al. |
| 2011/0123092 | A1 | 5/2011 | Sakamoto |
| 2014/0107998 | A1* | 4/2014 | Vukkadala .............. G06F 30/23 |
| | | | 703/14 |
| 2017/0038202 | A1* | 2/2017 | Saito ....................... G01B 21/30 |
| 2017/0108781 | A1 | 4/2017 | Van Beuzekom et al. |
| 2019/0013225 | A1 | 1/2019 | Taguchi et al. |
| 2019/0079411 | A1* | 3/2019 | Cekli .................. G03F 7/70258 |

FOREIGN PATENT DOCUMENTS

| | | |
|---|---|---|
| JP | H03106411 | 5/1991 |
| JP | H06337206 | 12/1994 |
| JP | H10189674 | 7/1998 |
| JP | 2001189351 | 7/2001 |
| JP | 2004119673 | 4/2004 |
| JP | 2015181145 | 10/2015 |
| JP | 2019016714 | 1/2019 |
| KR | 100674990 | 1/2007 |
| KR | 1020070043280 | 4/2007 |
| TW | 201833512 | 9/2018 |
| WO | 2009081990 | 7/2009 |
| WO | 2018086825 | 5/2018 |
| WO | 2019206548 | 10/2019 |

OTHER PUBLICATIONS

Taiwanese Office Action issued in corresponding Taiwanese Patent Application No. 109122721, dated Jun. 22, 2021.

Office Action issued in corresponding Japanese Patent Application No. 2021-574888, dated Mar. 10, 2023.

* cited by examiner

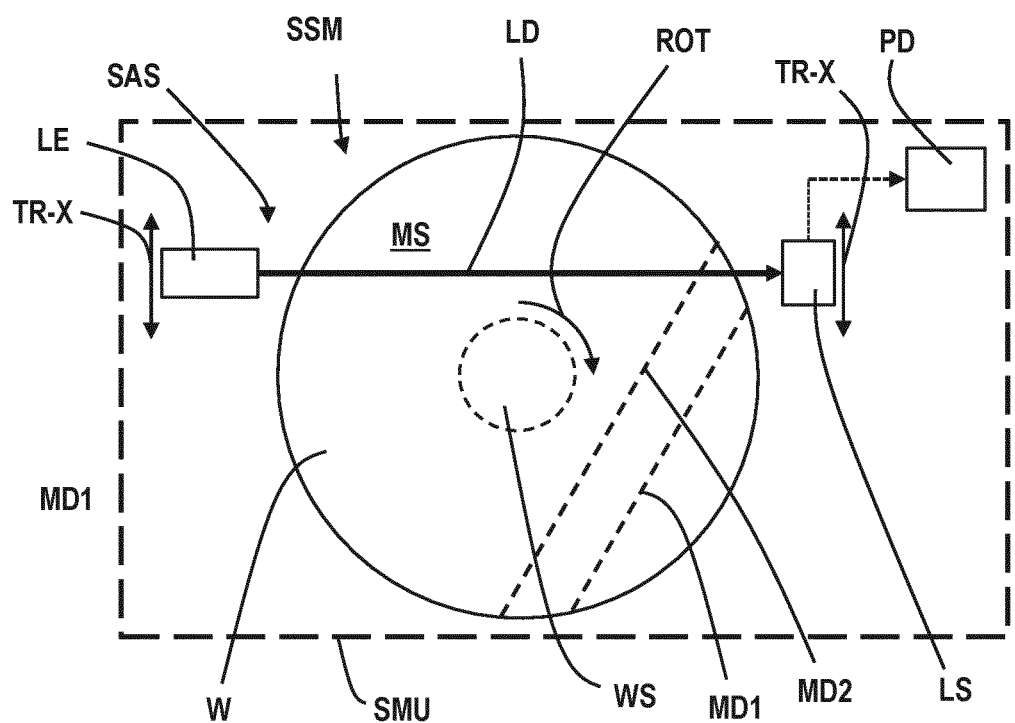
Fig. 7
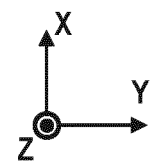

SUBSTRATE SHAPE MEASURING DEVICE, SUBSTRATE HANDLING DEVICE, SUBSTRATE SHAPE MEASURING UNIT AND METHOD TO HANDLE SUBSTRATES

CROSS-REFERENCE TO RELATED APPLICATION

The application is the U.S. national phase entry of PCT Patent Application No. PCT/EP2020/065873 which was filed on Jun. 8, 2020, which claims the benefit of priority of European Patent Application No. 19185930.5 which was filed on Jul. 12, 2019 and which is incorporated herein in its entirety by reference.

FIELD

The present invention relates to a substrate shape measuring device, a substrate handling device, a substrate shape measuring unit, and a method to handle substrates in a substrate handling device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

During the lithographic process, in which patterned layers are arranged on top each other, a substrate may, for example due to the internal stresses in or between the layers, become warped. These warped substrates have still to be properly handled by the devices used in the lithographic process. With increasing demands on the internal structure within the layers and the quantity of layers, e.g. about 200 layers, positioned on top of each other, the proper handling of warped substrate is becoming increasingly important.

In known embodiments of a lithographic apparatus, the substrate handling devices used for substrate handling are currently limiting warped substrate handling, such as the substrate table, loading pins on the substrate table and a gripper device to transfer a substrate.

Other tools that handle substrates, such as substrate inspection or measurement tools are also known to be limiting the maximum substrate warpage. Besides a possible performance decrease (e.g. overlay), the clampability of the substrate may already pose a problem in the handling of substrates. This means for example that vacuum levels for substrate clamping cannot be reached with the various components because the substrate warpage creates larger local gaps and substrate stiffness prevents closing these gaps by the (limited) suction pressure that is present. Another example is taking over the substrate from one submodule to the other, where for instance positions calibrated with flat substrate do not suffice beyond certain warpages.

In present devices that handle substrates, the maximum warpage limit of a substrate is around half a millimetre. However, there is a need to handle substrates that have a warpage that is above this maximum warpage limit. More generally, there is a need to provide a system that is capable of dealing with substrate warpage.

SUMMARY

It is an object of the invention to provide an improvement with respect to substrate handling of warped substrates and/or a device that can be used to improve handling of warped substrates.

The invention provides a substrate shape measuring device, comprising:

a substrate support to support a substrate having a main surface, said main surface of the substrate supported by the substrate support substantially extending in a first plane, one or more sensor assemblies, each comprising a light emitter to emit light in a direction substantially parallel to the first plane and a light sensor arranged to receive the light, wherein each of the one or more sensor assemblies is arranged to provide a light measurement signal representative for a dimension of the substrate in a direction perpendicular to the first plane, wherein the substrate shape measuring device is constructed to measure with the one or more sensor assemblies in at least a first measurement direction with respect to the substrate substantially parallel to the first plane and a second measurement direction with respect to the substrate substantially parallel to the first plane, wherein the first measurement direction and the second measurement direction are different, wherein the substrate shape measuring device comprises a processing device arranged to determine a shape of the substrate on the basis of a first light measurement signal obtained in the first measurement direction and a second light measurement signal obtained in the second measurement direction.

The invention provides a substrate handling device, the substrate handling device comprising the substrate shape measuring device of any of the claims 1-11.

The invention provides a substrate shape measuring unit, wherein the substrate shape measuring unit is a standalone unit comprising the substrate shape measuring device of any of the claims 1-11.

The invention provides a method to handle substrates in a substrate handling device, comprising:

determining a substrate shape of a substrate using the substrate shape measuring device of any of the claims 1-11, and adapting the handling of the substrate on the basis of the determined substrate shape.

BRIEF DESCRIPTION OF THE DRAWINGS

Embodiments of the invention will now be described, by way of example only, with reference to the accompanying schematic drawings, in which:

FIG. 7 depicts a top view of a substrate handling device according to a second embodiment of the invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
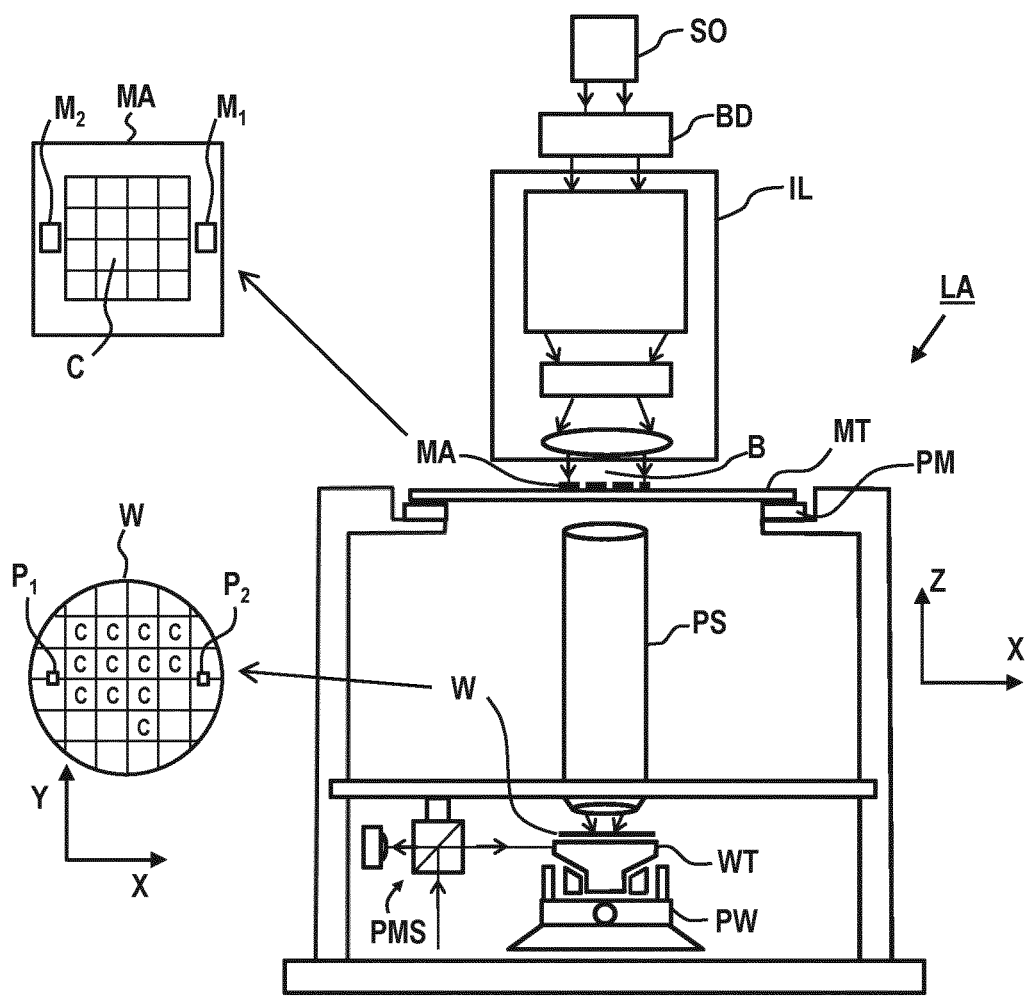
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as a Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
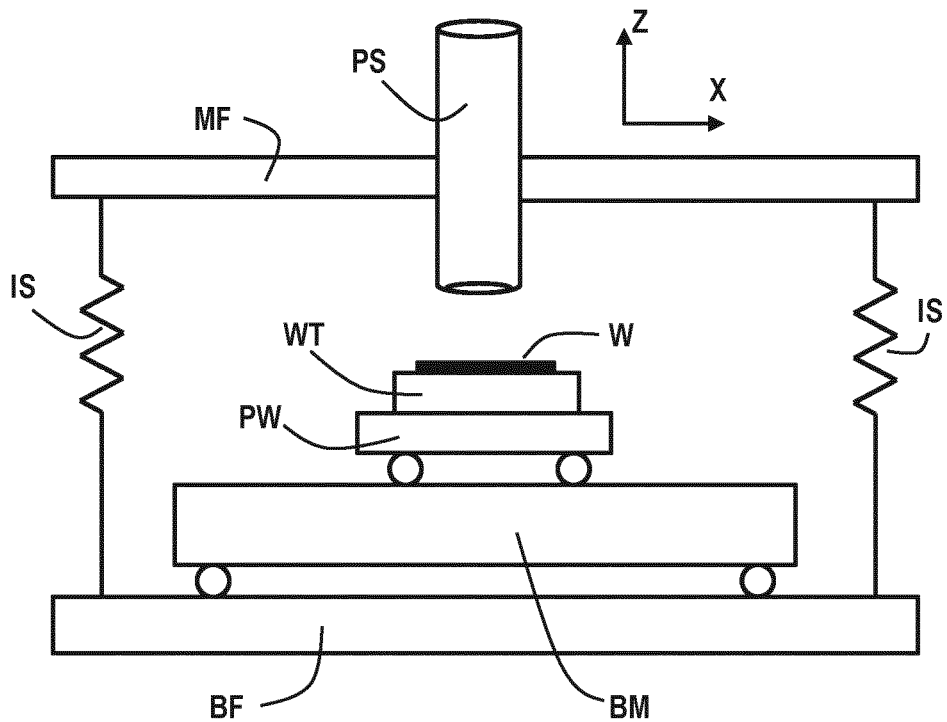
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
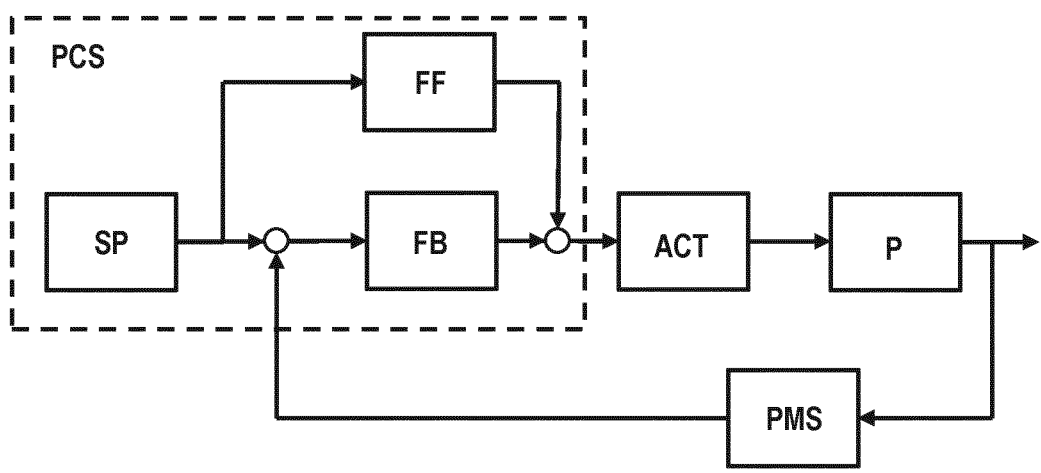
FIG. 3 schematically depicts a position control system.

The lithographic apparatus LA comprises a position control system PCS as schematically depicted in FIG. 3. The position control system PCS comprises a set-point generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The set-point generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

During the lithographic process, in which patterned layers are arranged on top of each other, a substrate may, for example due to the internal stresses in or between the layers, become warped. These warped substrates have still to be properly handled by the devices used in the lithographic process. In known embodiments of a lithographic apparatus, the substrate handling devices used for substrate handling, such as the substrate table, loading pins on the substrate table and a gripper device to transfer a substrate, may be limiting the handling of warped substrates.

Other tools that handle substrates, such as substrate inspection tools or measurement tools are also known to be able to handle substrates with only a limited maximum substrate warpage. Besides a possible performance decrease (e.g. overlay), the clampability of the substrate may pose a problem in the handling of substrates. This means for example that vacuum levels for substrate clamping cannot be reached with the various components because the substrate warpage creates larger local gaps and the substrate stiffness prevents closing these gaps by the (limited) suction pressure that is present.

In present devices that handle substrates, the maximum warpage limit of a substrate is around half a millimetre. However, there is a need to handle substrates that have a warpage that is above this maximum warpage limit, or more generally a need to provide a system that is capable of dealing with substrate warpage. Information with respect to the warpage of a substrate can be used to improve the handling of substrates, since this information can be used to adapt the wafer handling process.

The present invention provides a substrate shape measuring device to determine a shape of the substrate W. By determining the shape of the substrate W, this shape can be taken into account in further handling of the substrate W, for example by adaptations of a vacuum clamping process on a substrate table WT and/or by adaptations of the loading process of a substrate W on the loading pins of a substrate loading system of a substrate table WT.

The substrate shape measuring device may be provided at any suitable location. The substrate shape measuring device may be integrated in a substrate handling device, such as a substrate storage unit or substrate transfer device. The substrate shape measuring device may also be provided in a substrate shape measuring unit, i.e. a standalone unit arranged to determine a substrate shape, wherein the determined substrate shape can be used for further handling of the substrates.

Figure 4:
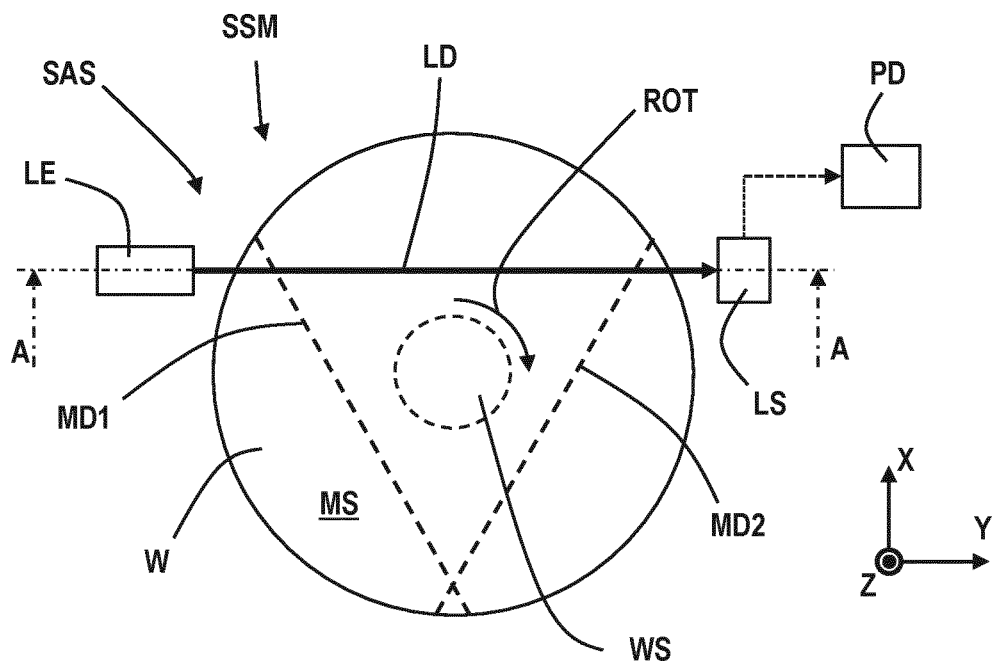
FIG. 4 depicts a top view of a substrate handling device according to a first embodiment of the invention.
Figure 5:
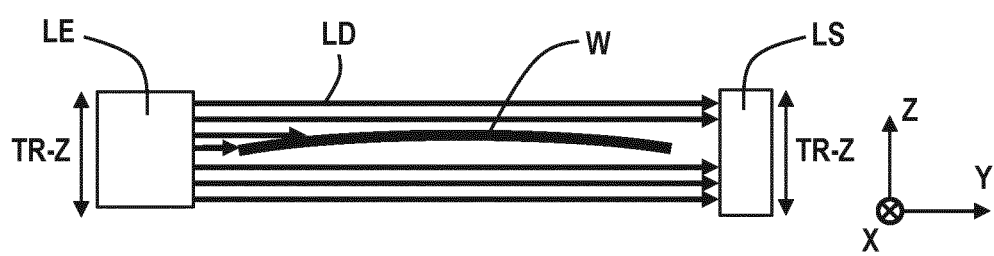
FIG. 5 depicts a cross section A-A of the first embodiment of FIG. 4.

FIG. 4 shows a top view of a substrate shape measuring device SSM according to a first embodiment of the invention. The substrate shape measuring device SSM is arranged to determine a shape of a substrate W. FIG. 5 shows a cross-section A-A of the embodiment shown in FIG. 4. The substrate W shown in FIG. 5 has a relatively extreme warpage. In practice, the warpage of the substrate W will be normally be substantially smaller with respect to the diameter of the substrate W.

The substrate shape measuring device SSM comprises a substrate support WS to support the substrate W. The substrate W comprises a main surface MS which extends in the supported position on the substrate support WS mainly in a first plane. The main surface MS may have the layer of radiation-sensitive material. The main surface MS may be the surface on which the integrated circuits (IC's) are formed. In the embodiment shown in FIG. 4, the first plane extends parallel to the x-y plane. The substrate support WS is arranged to rotate the substrate W around a central z-axis, as indicated by the arrow ROT.

The substrate shape measuring device SSM further comprises a sensor assembly SAS. The sensor assembly SAS comprises a light emitter LE to emit light along a light axis LD substantially parallel to the first plane, and a light sensor LS arranged to receive the light that is propagated along the light axis LD.

By rotation of the substrate W, the light axis LD of the sensor assembly SAS can be aligned with different measurement directions with respect to the substrate W. In FIG. 4 a first measurement direction MD1 and a second measurement direction MD2 are indicated. By rotation ROT of the substrate W, the light axis LD of the sensor assembly SAS may be aligned with the first measurement direction MD1 by positioning the substrate W in a first measurement position and the light axis LD of the sensor assembly SAS may be aligned with the second measurement direction MD2 by positioning the substrate W in a second measurement position. The light axis LD may also be aligned with many more measurement directions of the substrate W by positioning the substrate W in different rotational measurement positions with respect to the sensor assembly SAS. In an alternative embodiment, the sensor assembly SAS may at least partially rotate with respect to the substrate W. This rotation may be an optical rotation, i.e. optical elements of the sensor assembly create measurements in different measurement directions with respect to the substrate W.

As can be seen in FIG. 5, the light emitter LE is arranged to emit light over a substantial dimension in the z-direction, i.e. the light emitted by the light emitter LE forms a light curtain extending in y-direction and z-direction, wherein the beam(s) forming the light curtain propagate in the direction of the light axis LD, i.e. the y-direction in FIG. 4. The light emitter LE is for example a laser source that is configured to emit a laser curtain.

The light sensor LS is arranged to measure the light intensity of the light received by the light sensor LS. This measured intensity is used as a light measurement signal which is fed to a processing device PD. As can be seen in FIG. 5, a substantial part of the light emitted by the light emitter LE is blocked by the substrate W, and will therefore not be received by the light sensor LS. With increasing warpage of the substrate W more light will be blocked by the substrate W and the light intensity received by the light sensor LS will be smaller. The light measurement signal is therefore representative for a dimension of the substrate W in a direction perpendicular to the first plane.

To determine the shape of the substrate W, the light intensity of the light received by the light sensor in at least the first measurement direction MD1 and the second measurement direction MD2 may be measured.

The processing device PD is arranged to determine a shape of the substrate W on the basis of a first light intensity obtained in the first measurement direction MD1 and a second light intensity obtained in the second measurement direction MD2.

To improve the accuracy of the determination of the shape of the substrate W, further measurements may be carried out in further measurement directions. For example, the light intensity may be measured in three measurement directions, each at measurement positions arranged at 120 degrees with respect to the other two measurement directions.

In addition, or as alternative for additional measurements in further measurement directions, the processing device PD may also use a shape model to determine the shape of the substrate W on the basis of the first light intensity obtained in the first measurement direction MD1 and the second light intensity obtained in the second measurement direction MD2.

Warped substrates W usually, in dependence of the internal stresses in the substrate W, will deform in a certain shape, for example a saddle, bowl, umbrella or half pipe shape. The shape of this warpage can be used to determine a shape of the substrate W. By determining the extent of warpage in at least the first measurement direction MD1 and the second measurement direction MD2, and fitting a shape model of the warpage of the substrate W on these determined warpage in the first measurement direction MD1 and the second measurement direction MD2, the shape of the whole substrate W may be determined.

The shape model may describe a saddle, bowl, umbrella or half pipe shape of the substrate W, corresponding to the shape of the typical warpage of the respective substrate W that will occur during the lithographic process in which multiple layers are added on the substrate W.

The sensor assembly SAS provides a single light measurement signal representative for the quantity of light which is received by the light sensor LS, i.e. the light emitted by the light emitter LE which is not blocked by the substrate W. On the basis of this light measurement signal it cannot be determined in which direction the substrate W has a warpage. For example, a bowl shape and an umbrella shape may not be distinguished on the basis of only measurements in the first measurement direction MD1 and the second measurement direction MD2 with the embodiment of FIGS. 4 and 5.

To determine whether the substrate has a bowl shaped warpage or an umbrella shaped warpage, the sensor assembly SAS is translatable in a translation direction TR-Z perpendicular to the first plane. In the embodiment of FIGS. 4 and 5, this translation direction TR-Z is the z-direction. By scanning the sensor assembly SAS, in the translation direction TR-Z and measuring simultaneously the light intensity, it can be determined at which position in z-direction, the blockage of the light in the respective measurement direction occurs. This position in z-direction can be compared with the position in z-direction of a known substrate shape measured in the substrate shape measuring device SSM or with the position in z-direction of the support surface of the substrate support WS, where the center part of the substrate W is supported. On the basis of this comparison, it can for example be determined whether the warpage of the substrate W is bowl shaped or umbrella shaped. In an alternative embodiment, the substrate W may be translated in z-direction with respect to the sensor assembly SAS to determine, the position in z-direction, in which the blockage of the light in the respective measurement direction occurs.

Since in the embodiment of FIG. 4 the substrate W is only partly supported by the substrate support WS, the gravity force may have an effect on the shape of the substrate W. This effect of the gravity force may be determined by using shape models and/or measurement of this effect on a substrate without warpage. Thus, when the shape of the substrate W including the gravity force may be determined, the gravity effect may be compensated to determine a shape of the substrate W without the effect of the gravity force.

The shape of the substrate W as determined with the substrate shape measuring device SSM, can be taken into account during further handling of the substrate W. The shape of the warped substrate W can for example be taken into account during a vacuum clamping process on a substrate table resulting in a more predictable and reliable clamping of the substrate W. Also, the substrate shape may be taken into account during positioning of the substrate, for example horizontal or vertical positioning corrections, for e.g. overlay corrections and/or leveling corrections This may improve the overlay and/or focus performance of an actual lithographic projection process. Further, the transfer of a substrate W between two substrate supports, can be improved when the shape of the substrate W is known. For instance, the optimal take-over height of the substrate W may be dependent on the warpage of the substrate W, and be taken into account when the warpage/shape of the substrate W is known. Also other effects that are dependent on the warpage of the substrate W may be compensated, such as a warpage dependent alignment effect, warpage dependent levelling edge behaviour and other warpage dependent performance factors.

Figure 6:
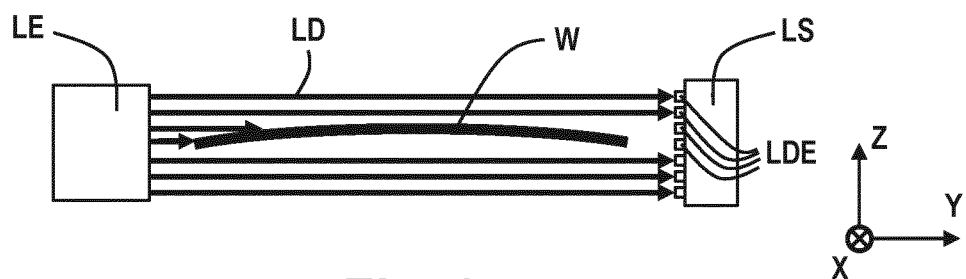
FIG. 6 depicts a cross section of an alternative embodiment of the sensor assembly of the substrate handling device.

FIG. 6 shows an alternative embodiment of a sensor assembly SAS arranged to determine the shape of the substrate W. The sensor assembly SAS comprises a light emitter LE and a light sensor LS. The light emitter LE is arranged to emit light in direction of the light axis LD. The light emitted by the light emitter LE is light curtain, for example a laser curtain, corresponding to the light emitter of the embodiment of FIGS. 4 and 5.

The light sensor LS of the embodiment of the sensor assembly SAS of FIG. 6 comprises an array of light detectors LDE extending in the z-direction, for example a CCD array extending in the z-direction. Each light detector LDE receives light emitted in the direction of the light axis LD, unless the light is blocked by the substrate W.

As each of the light detectors LDE provides a measurement representative for the presence of a substrate W at the respective position in z-direction of the light detector LDE, a shape of the substrate can be determined by the processing device PD on the basis of the light measurement signal of the light sensor LS comprising the individual measurements of the array of light detectors LDE.

Since the measurements of the array of light detectors LDE provide direct information on the position of the substrate W in z-direction, this position in z-direction can be compared with the position in z-direction of a known substrate shape measured in the substrate shape measuring device SSM or with the position of the support surface of the substrate support WS in z-direction. On the basis of this comparison, it can be determined whether the substrate W at the location of the measurement direction is in z-direction at a higher level or lower level than the support surface. This information may be relevant for the determination of the shape of the substrate W.

In a further alternative embodiment of the sensor assembly SAS, the light emitter LE may have an array of light emitting devices extending in z-direction that subsequently emit a light beam to be received by a light intensity sensor LS.

Any other suitable combination of light emitter and light sensor that can be used to determine a warpage of a substrate in a measurement direction substantially parallel to the main surface of the substrate W can also be applied. For instance, ultrasonic sensors, laser fibre intensity scan sensors, cameras, optical sensor with telecentric optics may be used FIG. 7 shows a second embodiment of a substrate shape measuring device SSM according to the invention. In the embodiment of FIG. 7, the substrate shape measuring device SSM is part of a standalone substrate shape measuring unit SMU. The substrate shape measuring unit SMU may for example be arranged close to a substrate storage unit, whereby a substrate W which is taken out of the substrate storage unit for further processing may be placed in the substrate shape measuring unit SMU to enable the substrate shape measuring device SSM to determine the shape of the substrate W. The determined shape can be used during further processing of the substrate to adapt the substrate handling to the actual shape of the substrate W.

The construction of the substrate shape measuring device SSM substantially corresponds to the substrate shape measuring device SSM of FIG. 4. A main difference between the embodiment of FIG. 4 and the embodiment of FIG. 7 is that the sensor assembly SAS can be translated in a translation direction TR-X extending in the first plane (in FIG. 7 the x-y-plane) and perpendicular to the light axis LD (in FIG. 7 the y-direction). In FIG. 7, this means that the sensor assembly SAS can be translated in the x-direction as indicated by the translation directions TR-X. By translation of the sensor assembly SAS in the x-direction, the measurement directions with respect to the substrate W can be displaced in radial direction of the substrate W, i.e. radially closer or further away from the center of the main surface MS of the substrate W.

The translation in the translation direction TR-X allows to measure in further measurement directions of the substrate W in order to obtain light measurement signals on the basis of which the shape of the substrate W may be determined. The measurement directions on the substrate W may be parallel and/or non-parallel directions. As an example, a first measurement direction MD1 and a second measurement direction MD2 of the substrate W are indicated in FIG. 7. For measurement in the first measurement direction MD1 and the second measurement direction MD2, the substrate W will remain in the same rotational position, but the sensor assembly SAS will be arranged in a first measurement position and a second measurement position, wherein the first measurement position and the second measurement position are spaced in the translation direction TR-X.

Figure 8:
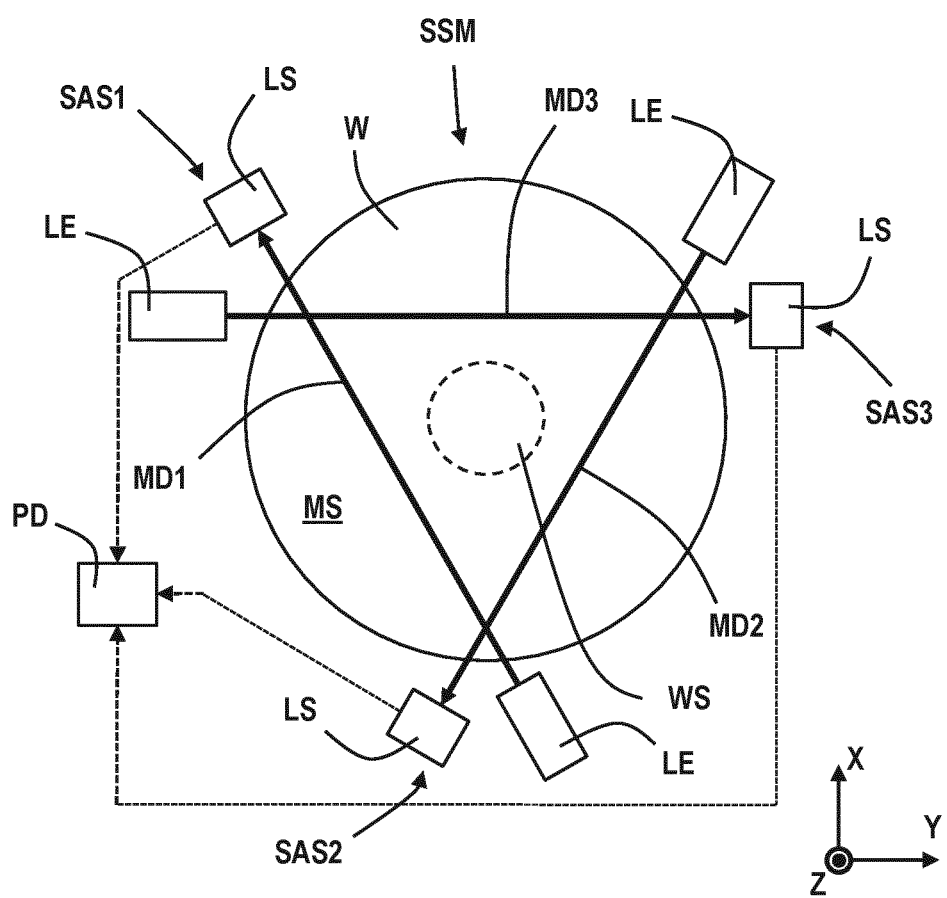
FIG. 8 depicts a top view of a substrate handling device according to a third embodiment of the invention.

FIG. 8 shows a third embodiment of a substrate shape measuring device SSM arranged to determine a shape of a substrate W. The substrate shape measuring device SSM comprises a substrate support WS to support the substrate W in a fixed rotational position. The substrate W comprises a main surface MS which extends in the supported position on the substrate support WS in a first plane.

The substrate shape measuring device SSM comprises a first sensor assembly SAS1, a second sensor assembly SAS2 and a third sensor assembly SAS3. Each of the first sensor assembly SAS1, second sensor assembly SAS2 and third sensor assembly SAS3 comprises a light emitter LE, for example a laser source, to emit light along a light axis substantially parallel to the first plane, and a light sensor LS arranged to receive the light that is propagated along the light axis.

The light axis of the first sensor assembly SAS1 is aligned with a first measurement direction MD1 with respect to the substrate W, the light axis of the second sensor assembly SAS2 is aligned with a second measurement direction MD2 with respect to the substrate W and the light axis of the third sensor assembly SAS3 is aligned with a third measurement direction MD3 with respect to the substrate W. The first measurement direction MD1, the second measurement direction MD2 and the third measurement direction MD3 are each arranged at an angle of 120 degrees with the other two measurement directions.

The light sensors LS are arranged to measure the light intensity of the light received by the respective light sensor LS. This measured intensity is used as a light measurement signal which is fed to a processing device PD. With increasing warpage of the substrate W more light will be blocked by the substrate W and the light intensity received by the light sensor LS will be smaller. To determine the shape of the substrate W, the light intensity of the light received by the respective light sensor LS for the first measurement direction MD1, the second measurement direction MD2 and the third measurement direction MD3 may be measured.

The processing device PD is arranged to determine a shape of the substrate W on the basis of the light intensities obtained in the first measurement direction MD1, the second measurement direction MD2 and the third measurement direction MD3. In addition, the processing device PD may also use a shape model to determine the shape of the substrate W, as described with respect to the embodiment of FIG. 4.

Figure 9:
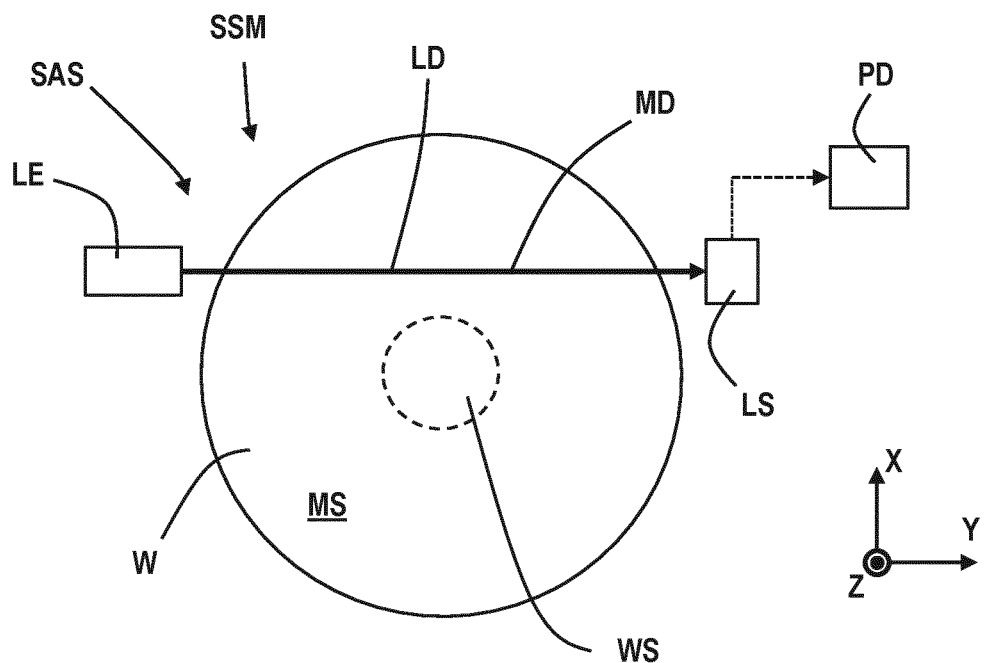
FIG. 9 depicts a top view of a substrate handling device according to a fourth embodiment.

FIG. 9 shows a fourth embodiment of a substrate shape measuring device SSM arranged to determine a shape of a substrate W. The substrate shape measuring device SSM comprises a substrate support WS to support the substrate W in a fixed rotational position. The substrate W comprises a main surface MS which extends in the supported position on the substrate support WS in a first plane.

The substrate shape measuring device SSM comprises a sensor assembly SAS comprising a light emitter LE, for example a laser source, to emit light along a light axis LD substantially parallel to the first plane, and a light sensor LS arranged to receive the light that is propagated along the light axis.

The light axis LD of the sensor assembly SAS is aligned with a measurement direction MD with respect to the substrate W.

The light sensor LS is arranged to measure the light intensity of the light received by the respective light sensor LS. This measured intensity is used as a light measurement signal which is fed to a processing device PD. With increasing warpage of the substrate W more light will be blocked by the substrate W and the light intensity received by the light sensor LS will be smaller.

The processing device PD is arranged to determine a shape of the substrate W on the basis of the light intensity obtained in the first measurement direction MD. In some applications, measurement along only one measurement direction MD is sufficient to determine a shape of the substrate W. In addition, the processing device PD may also use a shape model to determine the shape of the substrate W, as described with respect to the embodiment of FIG. 4.

The sensor assembly SAS and/or the substrate W may be movable in z-direction with respect to each other, as discussed with respect to FIG. 5, to enable the sensor assembly SAS to distinguish between a bowl shape substrate and an umbrella shaped substrate.

As described above, the shape as determined by the substrate shape measuring device SSM may be used to optimize the substrate handling of the substrate W during further processing of the substrate W.

The sensor assemblies may also be arranged to measure along other measurement directions. Also other numbers of sensor assemblies may be used to measure wafer warpage along a measurement direction of the substrate W.

In this application the light axis is the direction of the light beam of the respective sensor assembly, while measurement directions are directions defined with respect to the substrate W along which wafer deformation may be measured. In the embodiments of FIGS. 4 and 7, the light axis of the sensor assembly SAS may be aligned with different measurement directions by relative displacement of the substrate W with respect to the sensor assembly SAS between different measurement positions. In the embodiment of FIG. 8, the light axis of each of the sensor assemblies corresponds with the measurement directions of the substrate. The measurement directions of the substrate W may not be known before the measurement with the substrate shape measuring device SSM, but may be the result of the rotational position in which the substrate W is positioned on the substrate support WS. This rotational position may be unknown.

In an embodiment according to the invention the (pre-)alignment of the wafer may be further improved based on the determined substrate shape. In such an embodiment the substrate shape data could be used to shorten the time required for (pre-)alignment as additional rotation data and XY eccentricity data can be derived from the substrate shape data. This advantageous to improve handling of warped substrates in view of throughput and/or to further increase the accuracy of the handling process.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set-out as in the following numbered clauses.

1. A substrate shape measuring device, comprising:
   a substrate support to support a substrate having a main surface, said main surface of the substrate when supported by the substrate support substantially extending in a first plane,
   one or more sensor assemblies, each comprising a light emitter to emit light along a light axis substantially parallel to the first plane and a light sensor arranged to receive the light, wherein each of the one or more sensor assemblies is arranged to provide a light measurement signal representative for a dimension of the substrate in a direction perpendicular to the first plane,
   wherein the substrate shape measuring device is constructed to measure with the one or more sensor assemblies in at least a first measurement direction with respect to the substrate substantially parallel to the first plane and a second measurement direction with respect to the substrate substantially parallel to the first plane, wherein the first measurement direction and the second measurement direction are different, and
   wherein the substrate shape measuring device comprises a processing device arranged to determine a shape of the substrate on the basis of a first light measurement signal obtained in the first measurement direction and a second light measurement signal obtained in the second measurement direction.
2. The substrate shape measuring device of clause 1, wherein the first measurement direction and the second measurement direction are non-parallel to each other.
3. The substrate shape measuring device of any of the preceding clauses, wherein the processing device uses a shape model to determine the shape of the substrate on the basis of the light measurement signal obtained in the first measurement direction and the light measurement signal obtained in the second measurement direction.
4. The substrate shape measuring device of any of the preceding clauses, wherein the substrate support and/or the one or more sensor assemblies are constructed to move the substrate with respect to the one or more sensor assemblies between at least a first measurement position, in which the one or more sensor assemblies are arranged to align the light axis with the first measurement direction and a second measurement position, in which one or more sensor assemblies are arranged with respect to the substrate to align the light axis with the second measurement direction.
5. The substrate shape measuring device of clause 4, wherein the substrate support and/or the one or more sensor assemblies are arranged to rotate the substrate with respect to the one or more sensor assemblies between the first measurement position and the second measurement position.
6. The substrate shape measuring device of clause 4 or 5, wherein the substrate support and/or the one or more sensor assemblies are arranged to translate the substrate with respect to the one or more sensor assemblies between the first measurement position and the second measurement position.
7. The substrate shape measuring device of any of the preceding clauses, wherein the substrate shape measuring device comprises two or more sensor assemblies,
   wherein a first sensor assembly of the two or more sensor assemblies comprises a first light emitter to emit light in the first measurement direction and a first light sensor arranged to receive the light propagating in the first measurement direction, and
   wherein a second sensor assembly of the two or more sensor assemblies comprises a second light emitter to emit light in the second measurement direction and a second light sensor arranged to receive the light propagating in the second measurement direction.
8. The substrate shape measuring device of clause 7, wherein the substrate shape measuring device comprises three sensor assemblies,
   wherein a third sensor assembly comprises a third light emitter to emit light in a third measurement direction substantially parallel to the first plane and a third light sensor arranged to receive the light propagating in the third measurement direction.
9. The substrate shape measuring device of clause 8, wherein the first measurement direction, the second measurement direction and the third measurement direction are aligned at approximately 120 degrees with respect to each other.
10. The substrate shape measuring device of any of the preceding clauses, wherein the light measurement signal is a light intensity signal of light received by the respective light sensor.
11. The substrate shape measuring device of clause 10, wherein the substrate support and/or the one or more sensor assemblies are constructed to move the substrate with respect to the at least one sensor assembly in a direction perpendicular to the first plane.
12. A substrate handling device, the substrate handling device comprising the substrate shape measuring device of any of the preceding clauses.
13. A substrate shape measuring unit, wherein the substrate shape measuring unit is a standalone unit comprising the substrate shape measuring device of any of the clauses 1-11.
14. A method to handle substrates in a substrate handling device, comprising:
   determining a substrate shape of a substrate using the substrate shape measuring device of any of the clauses 1-11, and
   adapting the handling of the substrate on the basis of the determined substrate shape.
15. The method of clause 14, wherein adapting the handling of the substrate comprises:
   adapting a clamping process of the substrate on a substrate table having a substrate clamp on the basis of the determined substrate shape, and/or
   adapting a support plane provided by loading pins of a loading unit of a substrate table on the basis of the determined substrate shape, and/or
   adapting positioning of the substrate during a lithographic process on the basis of the determined substrate shape.

The invention claimed is:
1. A substrate shape measuring device, comprising:
   a substrate support to support a substrate having a main surface, the main surface of the substrate when supported by the substrate support substantially extending in a plane;
   one or more sensor assemblies, each comprising a light emitter to emit light along a light axis substantially parallel to the plane and a light sensor arranged to receive the light, wherein each of the one or more sensor assemblies is arranged to provide a light measurement signal representative for a dimension of the substrate in a direction perpendicular to the plane,
   wherein the substrate shape measuring device is constructed to measure with the one or more sensor assemblies in at least a first measurement direction with respect to the substrate substantially parallel to the plane and at least a second measurement direction with respect to the substrate substantially parallel to the plane, wherein the first measurement direction and the second measurement direction are different; and a processing device arranged to determine a shape of the substrate on the basis of a first light measurement signal obtained in the first measurement direction and a second light measurement signal obtained in the second measurement direction, wherein the processing device uses a shape model to determine the shape of the substrate on the basis of the first and second light measurement signals.

2. The substrate shape measuring device of claim 1, wherein the first measurement direction and the second measurement direction are non-parallel to each other.

3. The substrate shape measuring device of claim 1, wherein the substrate support and/or the one or more sensor assemblies are constructed to provide relative movement between the substrate and the one or more sensor assemblies between at least a first measurement position, in which the one or more sensor assemblies are arranged to align the light axis with the first measurement direction and a second measurement position, in which one or more sensor assemblies are arranged with respect to the substrate to align a light axis with the second measurement direction.

4. The substrate shape measuring device of claim 3, wherein the substrate support and/or the one or more sensor assemblies are arranged to provide relative rotation between the substrate and the one or more sensor assemblies between the first measurement position and the second measurement position.

5. The substrate shape measuring device of claim 3, wherein the substrate support and/or the one or more sensor assemblies are arranged provide relative translation between the substrate and the one or more sensor assemblies between the first measurement position and the second measurement position.

6. The substrate shape measuring device of claim 1, wherein the substrate shape measuring device comprises two or more sensor assemblies,
wherein a first sensor assembly of the two or more sensor assemblies comprises a first light emitter to emit light in the first measurement direction and a first light sensor arranged to receive the light propagating in the first measurement direction, and
wherein a second sensor assembly of the two or more sensor assemblies comprises a second light emitter to emit light in the second measurement direction and a second light sensor arranged to receive the light propagating in the second measurement direction.

7. The substrate shape measuring device of claim 6, wherein the substrate shape measuring device comprises three sensor assemblies,
wherein a third sensor assembly comprises a third light emitter to emit light in a third measurement direction substantially parallel to the plane and a third light sensor arranged to receive the light propagating in the third measurement direction.

8. The substrate shape measuring device of claim 7, wherein the first measurement direction, the second measurement direction and the third measurement direction are aligned at approximately 120 degrees with respect to each other.

9. The substrate shape measuring device of claim 1, wherein the light measurement signal is a light intensity signal of light received by the respective light sensor.

10. The substrate shape measuring device of claim 9, wherein the substrate support and/or the one or more sensor assemblies are constructed to provide relative movement between the substrate and the at least one sensor assembly in a direction perpendicular to the plane.

11. A substrate handling device, the substrate handling device comprising the substrate shape measuring device of claim 1.

12. A substrate shape measuring unit, wherein the substrate shape measuring unit is a standalone unit comprising the substrate shape measuring device of claim 1.

13. A method to handle substrates in a substrate handling device, the method comprising:
determining a substrate shape of a substrate using the substrate shape measuring device of claim 1, and
adapting handling of the substrate on the basis of the determined substrate shape.

14. The method of claim 13, wherein the adapting the handling of the substrate comprises:
adapting a clamping process of the substrate on a substrate table having a substrate clamp on the basis of the determined substrate shape, and/or
adapting a support plane provided by loading pins of a loading unit of a substrate table on the basis of the determined substrate shape, and/or
adapting positioning of the substrate during a lithographic process on the basis of the determined substrate shape.

15. The method of claim 13, wherein the first measurement direction and the second measurement direction are non-parallel to each other.

16. A computer program product comprising a non-transitory computer-readable medium having instructions therein, the instructions, when executed by a machine, are configured to cause the machine to at least:
obtain a first light measurement signal measured with one or more sensor assemblies in at least a first measurement direction with respect to a substrate substantially parallel to a main surface of the substrate substantially extending in a plane and obtain a second light measurement signal measured with the one or more sensor assemblies in at least a second measurement direction with respect to the substrate substantially parallel to the plane, wherein the first measurement direction and the second measurement direction are different and each of the one or more sensor assemblies is arranged to provide the respective light measurement signal representative for a dimension of the substrate in a direction perpendicular to the plane; and
determine a shape of the substrate using a shape model to determine the shape of the substrate on the basis of the first light measurement signal obtained in the first measurement direction and the second light measurement signal obtained in the second measurement direction.

17. The computer program product of claim 16, wherein the first measurement direction and the second measurement direction are non-parallel to each other.

18. The computer program product of claim 16, wherein the instructions are further configured to cause the machine to obtain a third light measurement signal measured with one or more sensor assemblies in at least a third measurement direction with respect to the substrate substantially parallel to the plane, wherein the first, second and third measurement directions are different.

19. The computer program product of claim 16, wherein the instructions are further configured to cause the machine to provide a signal to adapt handling of the substrate on the basis of the determined substrate shape.

20. The computer program product of claim 16, wherein the instructions configured to cause the machine to provide the signal to adapt handling of the substrate are further configured to cause the machine to provide a signal to:
   adapt a clamping process of the substrate on a substrate table having a substrate clamp on the basis of the determined substrate shape, and/or
   adapt a support plane provided by loading pins of a loading unit of a substrate table on the basis of the determined substrate shape, and/or
   adapt positioning of the substrate during a lithographic process on the basis of the determined substrate shape.

\* \* \* \* \*